(12) United States Patent
Ramanathan et al.

(10) Patent No.: US 8,236,609 B2
(45) Date of Patent: Aug. 7, 2012

(54) PACKAGING AN INTEGRATED CIRCUIT DIE WITH BACKSIDE METALLIZATION

(75) Inventors: Lakshmi N. Ramanathan, Chandler, AZ (US); Craig S. Amrine, Tempe, AZ (US); Jianwen Xu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 1041 days.

(21) Appl. No.: 12/184,377

(22) Filed: Aug. 1, 2008

(65) Prior Publication Data

US 2010/0029045 A1    Feb. 4, 2010

(51) Int. Cl.
 *H01L 21/56*    (2006.01)
(52) U.S. Cl. ........ 438/110; 438/122; 438/124; 438/126; 438/127; 438/464; 257/E21.502
(58) Field of Classification Search ................. 438/110, 438/122, 124, 126, 127, 464; 257/E21.498, 257/E21.502
See application file for complete search history.

(56) References Cited

U.S. PATENT DOCUMENTS

| | | | |
|---|---|---|---|
| 6,838,776 B2 | 1/2005 | Leal et al. | |
| 6,921,975 B2 | 7/2005 | Leal et al. | |
| 6,933,813 B2 | 8/2005 | Burdick, Jr. et al. | |
| 7,262,444 B2 | 8/2007 | Fillion et al. | |
| 7,741,194 B2 * | 6/2010 | Griffiths | 438/458 |
| 2007/0025092 A1 | 2/2007 | Lee et al. | |
| 2007/0235810 A1 | 10/2007 | Delgado et al. | |

* cited by examiner

*Primary Examiner* — Mary Wilczewski
*Assistant Examiner* — Toniae Thomas
(74) *Attorney, Agent, or Firm* — Meschkow & Gresham, P.L.C.

(57) ABSTRACT

A method (32) of packaging integrated circuit (IC) dies (48) includes applying (36) a laminating material (44) to a wafer (40), and separating (46) the wafer (40) into multiple IC dies (48) such that the laminating material (44) is applied to back surfaces (52) of the IC dies (48). Each of the IC dies (48) is positioned (62) with an active surface (50) facing a support substrate (56). An encapsulant layer (72) is formed (64) overlying the laminating material (44) and the back surfaces (52) of the IC dies (48) from a molding compound (66). The molding compound (66) and the laminating material (44) are removed from the back surfaces (52) of the IC dies (48) to form (76) openings (78) exposing the back surfaces (52). Conductive material (84, 88) is placed in the openings (78) and functions as a heat sink and/or a ground for the IC dies (48).

16 Claims, 7 Drawing Sheets

*FIG. 1*

*PRIOR ART*

PACKAGING AN INTEGRATED CIRCUIT DIE WITH BACKSIDE METALLIZATION

TECHNICAL FIELD OF THE INVENTION

The present invention relates generally to integrated circuit die packages. More specifically, the present invention relates to packaging an integrated circuit die with backside metallization.

BACKGROUND OF THE INVENTION

Integrated circuit packaging has a significant effect on the appearance and function of end-user devices, from computers to cell phones to embedded processors. The packaging of IC devices should protect the integrated circuit die and allow coupling external to the IC die as needed. Integrated circuit (IC) packaging has evolved through multiple types of packaging technologies including, for example, system in package, package on package, chips first packaging, and so forth. In addition, it is becoming more common to commercially transfer or sell IC devices that have only been partially packaged. These partially packaged IC devices can then be optionally combined with other circuit devices and packaged in a final form to produce the desired final circuit.

In chips-first packaging, the IC die or dies are at least partially encapsulated in a molding compound. The IC die or dies are then mounted to an inert substrate with their active surfaces face up. Interconnect circuitry is then built above the active surface of the IC dies. The interconnect circuitry is formed to the IC chip as an integral part of the processing, thus eliminating the need for wire bonds, tape-automated bonds (TABs), or solder bumps. Furthermore, such a packaging technique can support high density interconnect routing, can minimize package area by reducing the distance between die contact and package ball grid array or pads, can improve power efficiency, and so forth.

Figure 1:
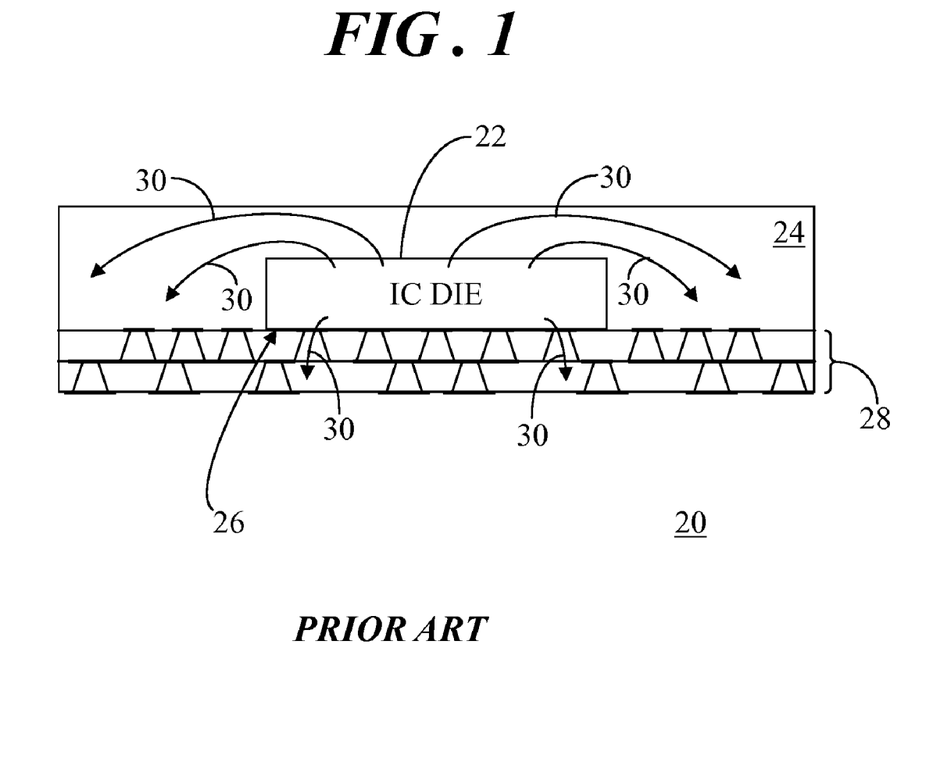
FIG. 1 shows a side view of a prior art integrated circuit (IC) die package.

FIG. 1 shows a side view of a prior art integrated circuit (IC) die package 20 which may be packaged in accordance with a chips-first packaging technique. IC die package 20 includes an IC die 22 largely encapsulated in a molding compound 24. Following the encapsulation of IC die 22 in molding compound 24, an active surface 26 of IC die 22 is electrically coupled with an interconnect layer 28. Interconnect layer 28 may include one or more levels of interconnect and may be formed using a variety of processes such as, for example, high density interconnect build-up, lamination, thin film processing, and so forth. IC die 22 may be a power amplifier semiconductor device. Arrows 30 represent the heat generated by IC die 22 during operation.

Power amplifier semiconductor devices are discrete devices or integrated circuits intended for high current or high voltage applications. Due to relatively large current conduction, all power semiconductor devices heat up. Unfortunately, semiconductors do not perform well and/or can fail at elevated temperatures. Therefore, a power semiconductor device needs to be cooled by removing that heat continuously. Chips-first packaging of some power semiconductor devices has been problematic because the molding compound that encapsulates such a power amplifier IC die does not effectively dissipate heat generated by the power amplifier semiconductor device. This trapped heat can cause poor performance and/or failure of the power amplifier semiconductor device.

Additionally, radio frequency (RF) semiconductor design calls for the effective grounding of such RF devices. The encapsulation of an RF device in molding compound during chips-first packaging can complicate the inclusion of effective grounding in such a device.

Accordingly, what is needed is a method for effectively packaging IC dies with improved heat dissipation capability and/or effective grounding capability that can be readily implemented in existing packaging methodologies while concurrently minimizing packaging thickness.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

Figure 2:
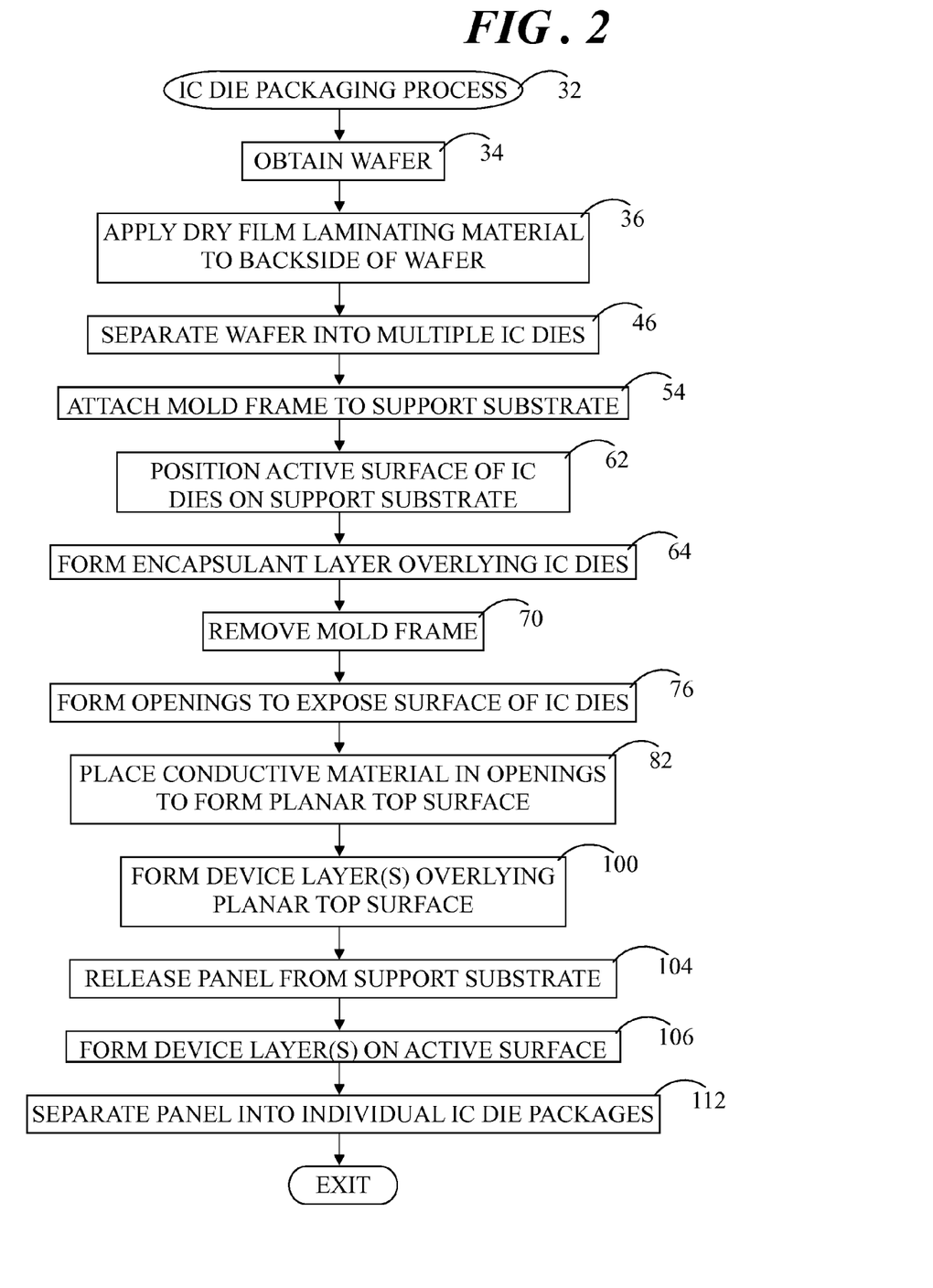
FIG. 2 shows a flowchart of an IC die packaging process in accordance with an embodiment of the invention.

FIG. 2 shows a flowchart of an integrated circuit (IC) die packaging process 32 in accordance with an embodiment of the invention. IC die packaging process 32 describes a chips-first packaging methodology for effectively packaging IC dies. Furthermore, IC die packaging process 32 entails a backside metallization technique (discussed below) that can improve heat dissipation capability and/or provide effective grounding capability, while concurrently minimizing packaging thickness. Moreover, process 32 is readily and cost effectively implemented in existing packaging methodologies.

IC die packaging process 32 begins with a task 34. At task 34, a wafer is obtained. The wafer has formed thereon multiple integrated circuits fabricated in accordance with a semiconductor fabrication process. A semiconductor fabrication process, or wafer processing, is a multiple-step sequence of photographic and chemical processing steps during which integrated circuits are gradually created on a wafer made of semiconducting material. Wafer processing may further entail verification tests between the various processing steps to verify that the wafer hasn't been damaged by previous processing steps. In addition, following integrated circuit fabrication, the integrated circuit devices may be subjected to a variety of electrical tests to determine whether they function properly.

Figure 3:
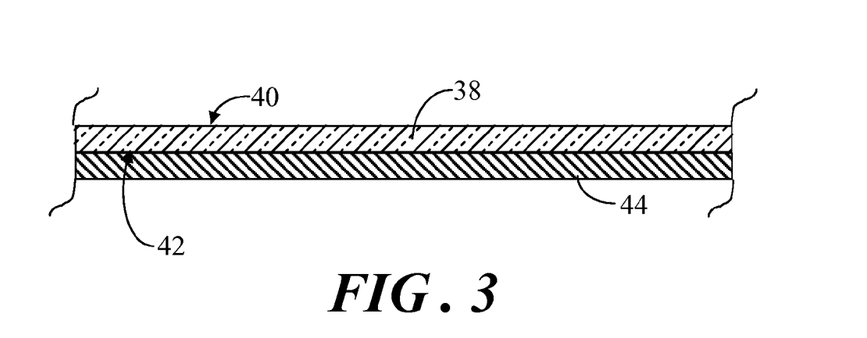
FIG. 3 shows a side view of a wafer at a beginning stage of packaging in accordance with the IC die packaging process of FIG. 2.

In response to task 34, a task 36 is performed. At task 36, a laminating material is applied to a backside of the wafer. Referring to FIG. 3 in connection with task 36, FIG. 3 shows a side view of a wafer 38 at a beginning stage of packaging in accordance with IC die packaging process 32 (FIG. 2). Wafer 38 has a topside 40 and a backside 42. The integrated circuits have been created on topside 40 of wafer 38. Wafer 38 may have undergone a wafer backgrinding, or thinning, process to reduce the thickness of wafer 38 so that the resulting integrated circuit dies can be put into thin devices. Since the integrated circuits have been created on topside 40 of wafer 38, backgrinding occurs on backside 42.

In accordance with task 36, a protective film such as a laminating material 44 is applied to backside 42 of wafer 38 following wafer backgrinding. Laminating material 44 may be any of a number of organic films, such as polyimide film, that may be used to protect backside 42 of wafer 38, but readily release from wafer 38 when needed. In one embodiment, laminating material may be a dry film (either a photoresist type or a non-photoresist type) of approximately one hundred microns thick that is applied to backside 42 of wafer 38.

Figure 4:
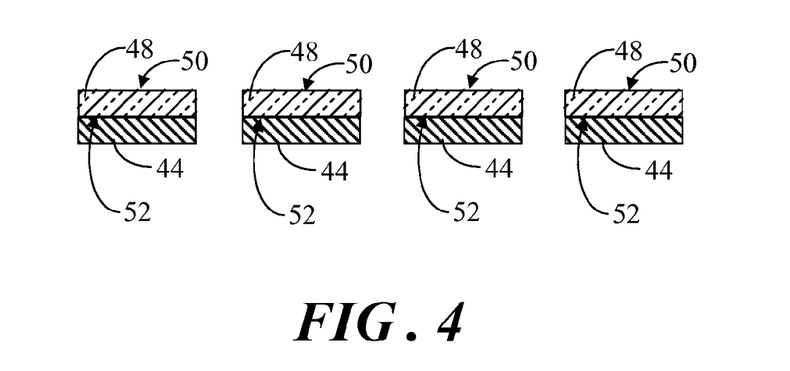
FIG. 4 shows a side view of a portion of IC dies formed by separating the wafer of FIG. 3 in accordance with the IC die packaging process.

Referring back to FIG. 2, following task 36, IC die packaging process 32 continues with a task 46. At task 46, wafer 38 (FIG. 3) is separated into multiple integrated circuit (IC) dies, also referred to as IC chips. Referring to FIG. 4 in connection with task 46, FIG. 4 shows a side view of a portion of IC dies 48 formed by separating wafer 38 (FIG. 3). Following integrated circuit fabrication and testing, wafer 38 may be scored and then broken or sawn into multiple discrete IC dies 48. Each of IC dies 48 has an active surface 50 and a back surface 52. Active surface 50 of IC dies 48 refers to that side of each of IC dies 48 having bond pads (not visible) for eventual connection with interconnect circuitry in accordance with a chips-first packaging technique (discussed below). Back surface 52 coincides with backside 42 (FIG. 3) of wafer 38 (FIG. 3). Accordingly, application of laminating material 44 on backside 42 of wafer 38 results in the commensurate application of laminating material 44 on back surface 52 of integrated circuit dies 48.

In the embodiment shown, the method is discussed in connection with the packaging of individual IC dies 48. However, the methodology applies equally to the packaging of multichip modules, each of which includes multiple individual IC dies that can perform various functions. In addition, several of the following figures only show four of IC dies 48 for simplicity of illustration. Those skilled in the art will understand that a multiplicity of IC dies 48 (or multi-chip modules) may be concurrently packaged.

Figure 5:
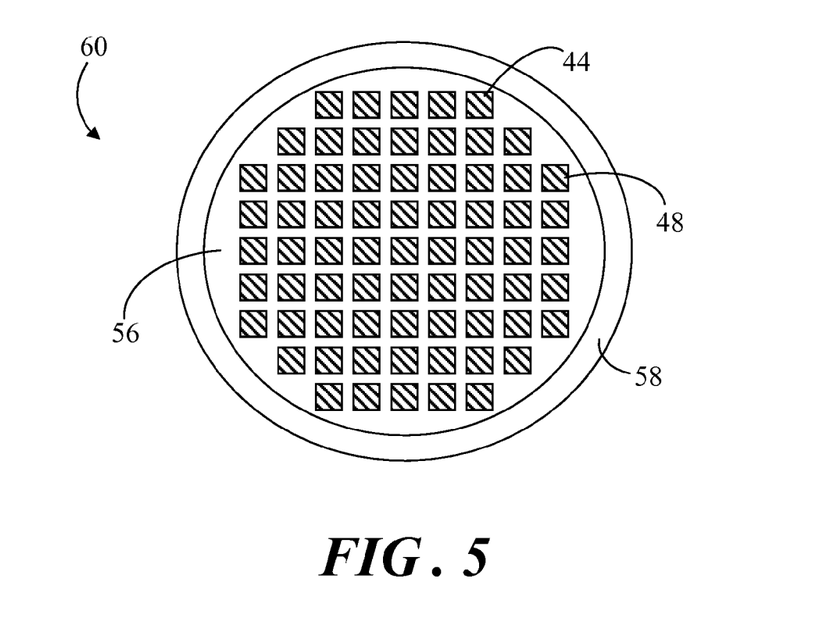
FIG. 5 shows a top view of multiple IC dies placed on a support substrate in accordance with the IC die packaging process.

Referring back to FIG. 2, IC die packaging process 32 continues with a task 54. At task 54, a mold frame is attached to a support structure. FIG. 5 shows a top view of multiple integrated circuit (IC) dies 48 (FIG. 4) placed on a support substrate 56 with the applied laminating material 44 facing upward in accordance with IC die packaging process 32. Support substrate 56 with an attached mold frame 58 together form an open mold cavity or a structure 60 for temporarily holding at least one of integrated circuit (IC) dies 48 (FIG. 5), and in this scenario multiple IC dies 48 during packaging thereof.

In one embodiment, support substrate 56 may have an attached thermal release adhesive tape (not shown). To ensure clean release of a panel of IC dies 48, a silicone adhesive tape (not shown) may then be added on top of the thermal release tape. Those skilled in the art will recognize that support substrate 56 can be manufactured from various materials to temporarily hold IC dies 48 during packaging. In addition, mold frame 58 is illustrated herein as being a generally ring-shaped structure. However, mold frame 58 may be various shapes and sizes in accordance with the IC die packaging machinery that is to be used.

Figure 6:
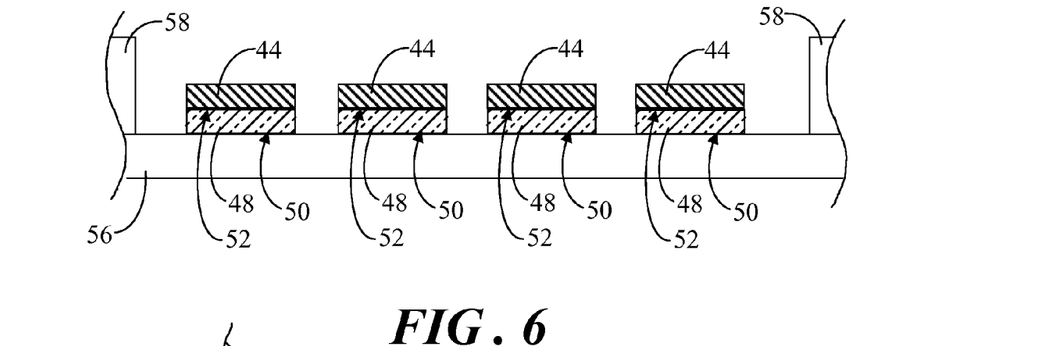
FIG. 6 shows a side view of the IC dies shown in FIG. 4 further along in processing.

With reference back to FIG. 2, following task 54, a task 62 is performed. At task 62, individual IC dies 48 are positioned on support substrate 56 within mold frame 58. Referring now to FIGS. 5 and 6, FIG. 6 shows a side view of IC dies 48 further along in processing. IC dies 48 are placed on support substrate 56 within mold frame 58 with active surface 50 of each of IC dies 48 face down on support substrate 56. Thus, laminating material 44 is face up relative to support substrate 56. As such, IC dies 48 are not visible in the top view illustrated in FIG. 5, but they are visible in the side view illustrated in FIG. 6. Task 62 may also entail the attachment of an embedded ground plane (not shown) onto support substrate 56 in accordance with pre-determined design requirements for the chip module. In one embodiment, the ground plane may have openings to accommodate IC dies 48.

Figure 7:
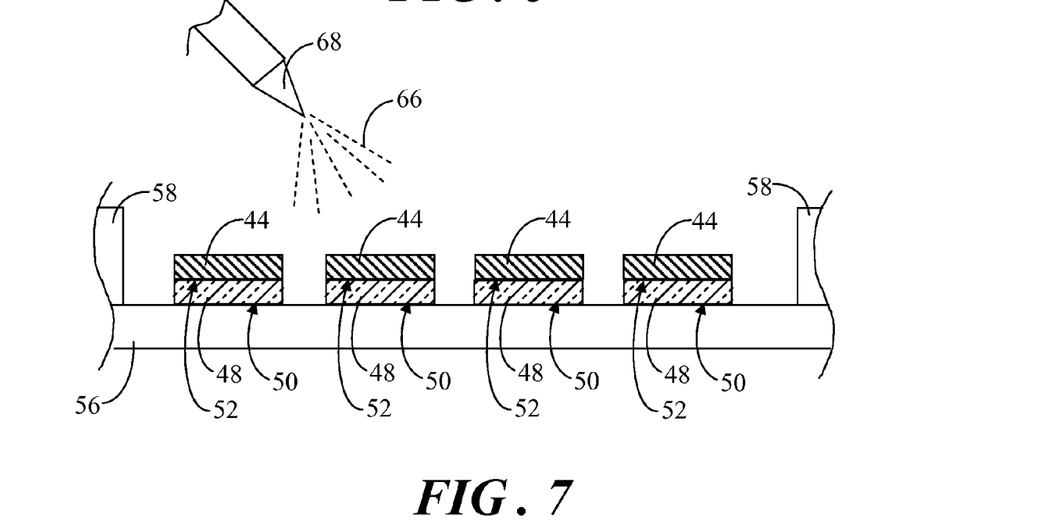
FIG. 7 shows a side view of the IC dies shown in FIG. 6 further along in processing.

Referring back to FIG. 2, following task 62, a task 64 is performed. At task 64, an encapsulant layer overlying laminating material 44 and IC dies 48 is formed from a molding compound. Referring to FIG. 7 in connection with task 64, FIG. 7 shows a side view of IC dies 48 shown in FIG. 6 further along in processing. In one embodiment, a molding compound 66 is distributed over IC dies 48 and the gaps between IC dies 48 within mold frame 58 from a nozzle 68 of conventional dispensing equipment. Molding compound 66 may be a conventional or upcoming plastic or epoxy resin compound in a form suitable for molding, such as in pellets, powder, gels, liquids, or granular form.

Nozzle 68 appears close to IC dies 48 for simplicity of illustration. However, those skilled in the art will recognize that nozzle 68 may be at a height above IC dies 48 that best facilitates the distribution of molding compound 66 over IC dies 48. Furthermore, nozzle 68 may be in a multitude of configurations for effectively delivering molding compound 66 over IC dies 48. For example, nozzle 68 may be non-movable and provide a single dispensing of molding compound 66 from above. Alternatively, nozzle 68 may move in a circular pattern or line-by-line, i.e., IC die 48 by IC die 48, during the dispensing of molding compound 66. After molding compound 66 is dispensed over IC dies 48, molding compound 66 may undergo a curing process until it reaches its maximum hardness.

Figure 8:
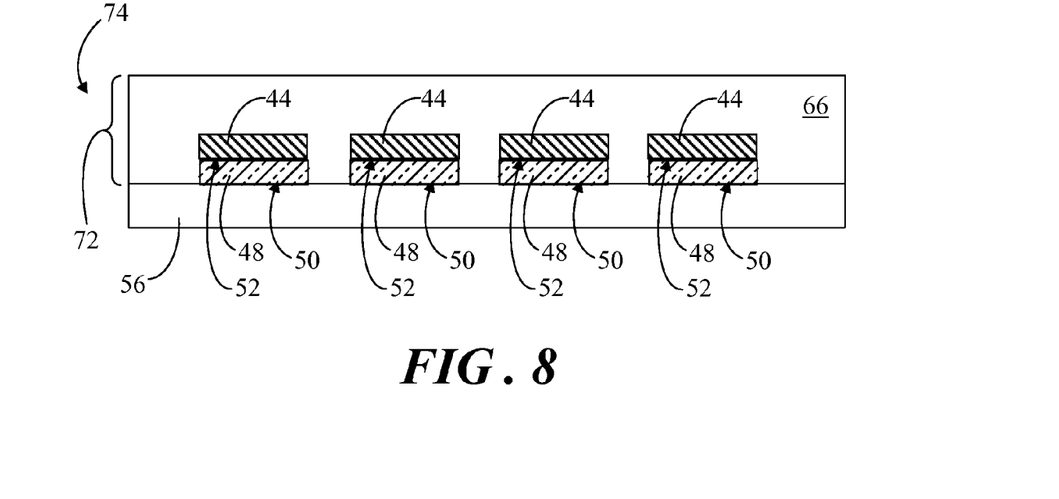
FIG. 8 shows a side view of the IC dies shown in FIG. 7 further along in processing.

Referring back to FIG. 2, following task 64, a task 70 is performed. At task 70, mold frame 58 is removed from support substrate 56. Referring to FIG. 8 in connection with task 64, FIG. 8 shows a side view of the portion of IC dies 48 shown in FIG. 7 further along in processing. Following task 64, an encapsulant layer 72 is formed over laminating material 44 applied to IC dies 48 and between IC dies 48. That is, molding compound 66 is now a solid, uniform encapsulant layer 72. Once IC dies 48 are encapsulated, a panel 74 containing multiple IC dies 48 is formed. Note that mold frame 58 has been removed. However, panel 74 is still attached to or otherwise supported by support substrate 56.

Figure 9:
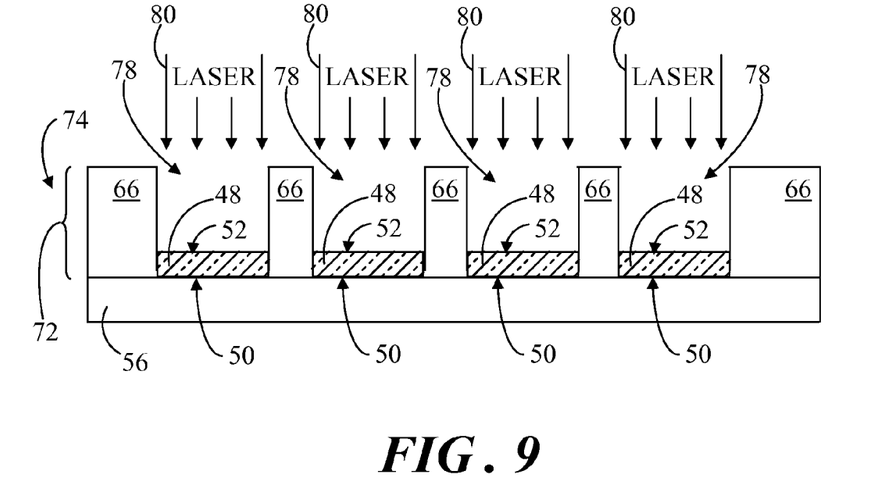
FIG. 9 shows a side view of the IC dies shown in FIG. 8 further along in processing.

With reference back to FIG. 2, following task 70, IC die packaging process continues with a task 76. A task 76, openings are formed in encapsulant layer 72 to expose back surface 52 of IC dies 48. Referring to FIG. 9 in connection with task 76, FIG. 9 shows a side view of IC dies 48 shown in FIG. 8 further along in processing. In accordance with an embodiment, molding compound 66 of encapsulant layer 72 and laminating material 44 (FIG. 8) that overlie back surface 52 are removed to form openings 78 that expose back surface 52 of IC dies 48.

Molding compound 66 and laminating material 44 may be removed by, for example, the use of a laser beam 80 to ablate molding compound 66 and laminating material 44, with back surface 52 of IC dies 48 being used as a laser stop. That is, the positioning and power of laser beam 80 is controlled so that molding compound 66 and laminating material 44 are removed and back surface 52 is undamaged. In one embodiment, laser beam 80 may be emitted from an ultraviolet (UV) laser. However, lasers that emit light at different wavelengths may alternatively be utilized. Laser removal of molding compound 66 and laminating material 44 is desirable due to the speed and the precise selectivity of material removal using laser beam 80. In addition, control of laser beam 80 is typically software programmable. In an alternative embodiment, however, molding compound 66 and laminating material 44 may be removed using an etching process, such as plasma etching, or by using another material removal process.

Following removal of molding compound 66 and laminating material 44, at least a portion of back surface 52 is exposed. Openings 78 may be produced in a variety of patterns in accordance with a predetermined design.

Figure 10:
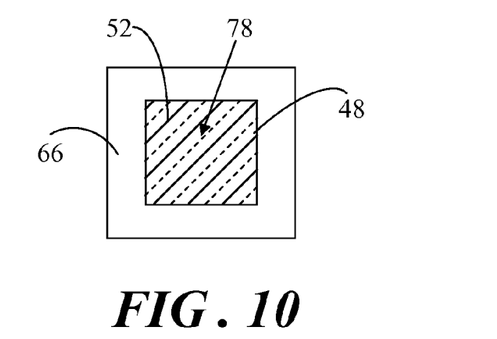
FIG. 10 shows a top view of one of the IC dies in which substantially an entirety of a surface of the IC die is exposed in accordance with an embodiment of the IC die packaging process.

FIG. 10 shows a top view of one of IC dies 48 in which substantially an entirety of back surface 52 of IC die 48 is exposed in accordance with an embodiment of IC die packaging process 32 (FIG. 2). In this embodiment, opening 78 is produced at task 76 (FIG. 2) the size of which largely exposes the entire back surface 52 of IC die 48.

Figure 11:
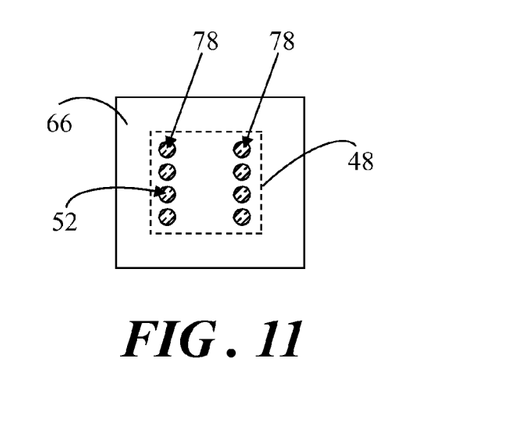
FIG. 11 shows a top view of one of the IC dies in which a section of a surface of the IC die is exposed in a predetermined pattern of openings in accordance with another embodiment of the IC die packaging process.

FIG. 11 shows a top view of one of IC dies 48 in which a section of back surface 52 of IC die 48 (shown in ghost form) is exposed in a predetermined pattern of openings 78 in accordance with another embodiment of the IC die packaging process 32. In this exemplary scenario, multiple openings 78 are formed to expose a relatively small section of back surface 52 as compared to the entirety of back surface 52 of IC die. Although FIG. 11 shows a predetermined pattern of circular multiple openings 78, it should be understood that various other patterns, shapes, and sizes of openings 78 may be produced. For example, openings 78 may be rectangular traces that expose back surface 52 of IC die 48.

Referring back to FIG. 2, following task 76 of IC die packaging process 32, a task 82 is performed. At task 82, conductive material is placed in openings 78.

Figure 12:
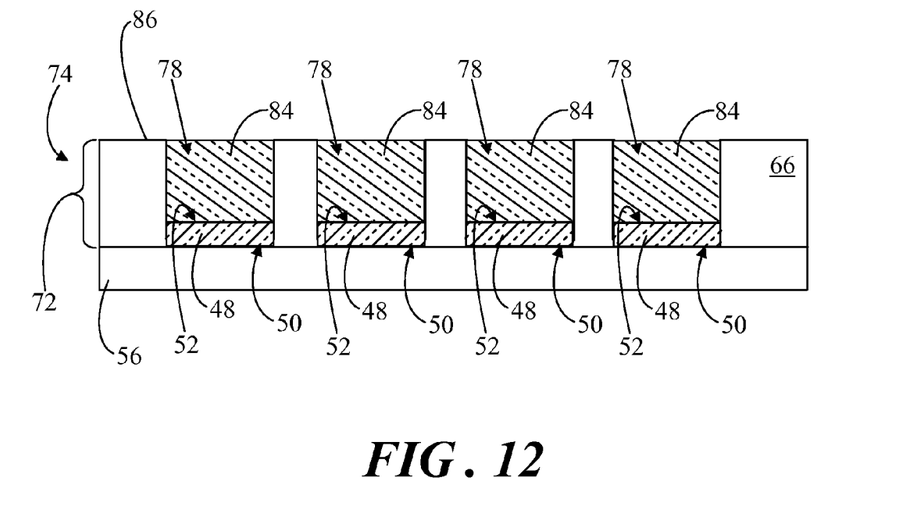
FIG. 12 shows a side view of the IC dies shown in FIG. 9 further along in processing in accordance with an embodiment of the IC die packaging process.

Referring to FIG. 12 in connection with task 82 of IC die packaging process 32, FIG. 12 shows a side view of IC dies 48 shown in FIG. 9 further along in processing in accordance with one embodiment. In the illustrated embodiment, openings 78 were produced that expose substantially an entirety of second surface 52 of each of IC dies 48. In accordance with task 82, a conductive material 84 is placed in these openings 78. Conductive material 84 fills each of openings 78 so that a planar top surface 86 of panel 74 is formed. Of course, a planarization operation may be performed following placement of conductive material 84 in openings 78 thus forming planar top surface 86. Top surface 86 is spaced apart from back surface 52 of each of IC dies 48 by the thickness of conductive material 84. A planar top surface 86 allows for interconnection of IC die 48 with another device, such as a customer provided device.

Conductive material 84 may be a metal-filled epoxy resin. For example, conductive material 84 may be a liquid epoxy resin material having a metal powder dispersed therein. The metal powder may be copper powder, aluminum powder, iron powder, gold powder, silver powder, nickel powder, chromium powder, and the like of a sufficient concentration so that conductive material 84 is electrically and/or thermally conductive. Alternatively, conductive material 84 may be an epoxy resin material that includes a non-metallic electrical and/or thermal conductor, such as graphite, silicon carbide, boron nitride, diamond, and so forth.

The placement of conductive material 84 within openings 78 is a back surface, or backside, metallization technique that can improve heat dissipation capability and/or provide effective grounding capability of IC dies 48, while concurrently minimizing packaging thickness. That is, conductive material 84 may function as a heat sink that absorbs thermal energy, i.e., heat, from IC die 48 using thermal contact to rapidly lower the temperature of IC die 48. Such a function is particularly useful when IC die 48 is a power amplifier semiconductor device intended for high current or high voltage applications which heats up during operation. Conductive material 84 can effectively and continuously remove heat from IC die 48. Prior art devices sometimes utilize a copper slug to which an encapsulated IC die may be attached for heat dissipation. The presence of conductive material 84 eliminates the need for an external heat sink element, thereby minimizing overall packaging thickness. In addition to its function as a heat sink, conductive material 84 may function to ground IC die 48. That is, conductive material 84 may interconnect at planar top surface 86 with ground traces, a ground plane, and the like. Such a function is useful when IC die 48 is a radio frequency (RF) power amplifier device where effective RF grounding is essential for ensuring good performance of the RF device.

Figure 13:
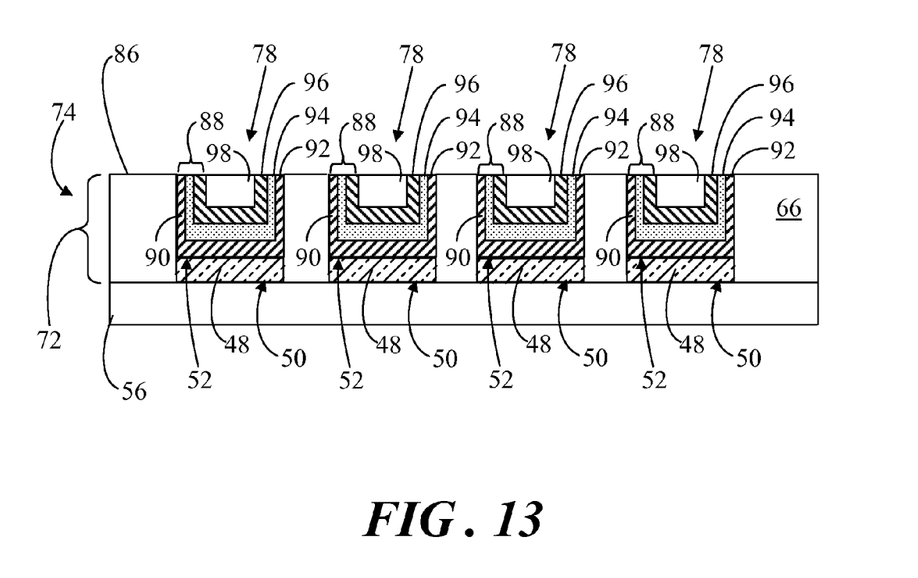
FIG. 13 shows a side view of the IC dies shown in FIG. 9 further along in processing in accordance with another embodiment of the IC die packaging process.

Referring to FIG. 13 in connection with task 82 of IC die packaging process 32, FIG. 13 shows a side view of IC dies 48 shown in FIG. 9 further along in processing in accordance with another embodiment. In this illustrated embodiment, openings 78 were produced that expose substantially an entirety of second surface 52 of each of IC dies 48. In accordance with task 82, conductive material in the form of a conductive metal film 88 is placed in these openings 78. In this example, conductive metal film 88 is utilized to produce interconnect structures 90 in the form of closed, or plated, shut vias. Conductive metal film 88, in this instance, includes a Titanium Tungsten (TiW) layer 92 overlying and in contact with back surface 52 of IC dies 48 as well as side surfaces of openings 78. A copper layer 94 is deposited on TiW layer 92, and another layer of copper 96 is electroplated on copper layer 94.

In semiconductor technology, copper based interconnect structures are increasingly being used because copper conducts electricity with lower resistance than aluminum which results in increased microprocessor speed. In addition, copper uses less power and costs less than aluminum. Furthermore, the physical attributes of copper metal allow for space-saving circuitry design. However, copper diffuses into silicon and silicon dioxide and reacts with many metals commonly used in microelectronic devices. TiW layer 92 can function as a barrier layer to prevent copper diffusion into back surface 52, while copper layer 94 functions as a heat sink and/or ground path. Conductive metal film 88 is described in one embodiment as including TiW layer 92, copper layer 94, and electroplated copper layer 96. Those skilled in the art will recognize that interconnect structures 90 can take on various configurations. For example, all or portions of conductive metal film 88 may be formed from other materials, with more or less layers, and so forth.

Following deposition of conductive metal film 88, the remaining unfilled portion of openings 78 is filled with a nonconductive material 98 to form planar top surface 86 spaced apart from second surface 52 of IC dies 48 as shown in FIG. 13. Nonconductive material 98 overlies a portion of conductive metal film 88 while the remainder of conductive metal film 88 remains exposed at planar top surface 86. Nonconductive material 98 may be a dielectric or epoxy with negligible electrical and/or thermal conductivity. Of course, a planarization operation may be performed following deposition of the various layers 92, 94, and 96, and nonconductive material 98 thus forming planar top surface 86.

The exemplary embodiments of FIGS. 12 and 13 show openings 78 that expose substantially an entirety of back surface 52. Furthermore, conductive material 84 (FIG. 12) entirely fills openings 78 to form planar top surface 86 (FIG. 12). Likewise, conductive metal film 90 (FIG. 13) and nonconductive material 98 (FIG. 13) entirely fill openings 78 to form planar top surface 86 (FIG. 13). However, as discussed above, openings 78 may be of various sizes and shapes in accordance with predetermined design criteria for IC dies 48. Consequently, the placement of conductive material 84 or the placement of conductive metal film 90 and nonconductive material 98 in openings 78 at task 82 (FIG. 2) can be adapted to accommodate the various sizes and shapes of openings 78. In addition, although conductive material 84 in the form of epoxy with conductive materials dispersed therein and conductive metal film 90 have been described, those skilled in the art will recognize that conductive material used to fill openings 78 can be other materials or take other forms.

With reference back to IC die packaging process 32 (FIG. 2) following the placement of conductive material in openings 78 at task 82, process 32 continues with a task 100. At task 100, device layers are formed overlying planar top surface 86 (FIG. 12) as needed.

Figure 14:
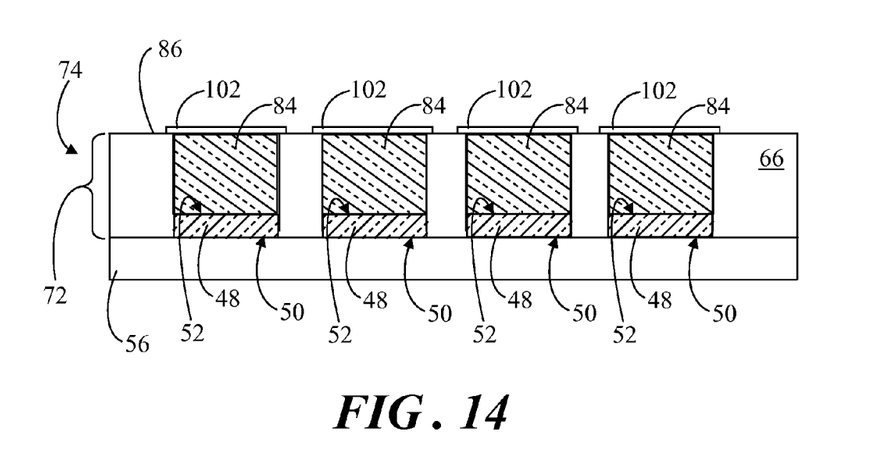
FIG. 14 shows a side view of the IC dies shown in FIG. 12 further along in processing.

Referring to FIG. 14 in connection with task 100, FIG. 14 shows a side view of IC dies 48 shown in FIG. 12 further along in processing. In accordance with task 100, one or more device layers 102 are formed in communication with back surface 52 of IC dies 48 via planar top surface 86 by, for example, deposition and etching processes. Device layers 102 may be land grid array pads, a ground plane, or any of various material layers that can function as an interconnect between IC dies 48 and customer provided devices or circuit boards. As shown in FIG. 14, panel 74 of IC dies 48 remains attached to support substrate 56 for stability and ease of handling. However, in another embodiment, support substrate 56 may have been previously removed.

Referring back to FIG. 2, following task 100, IC die packaging process 32 continues with a task 104. At task 104, the encapsulated IC dies 48 are released as a single unit, i.e., panel 74 (FIG. 14), from support substrate 56. For example, support substrate 56 may be pulled away from panel 74 utilizing the appropriate machinery. A silicone adhesive material (not shown) between support substrate 56 and active surface 50 (FIG. 4) of IC dies 48 releases or separates from active surface 52 of IC dies 48. Per conventional processes, any residual silicone adhesive material may be cleaned away from the bond pads (not shown) on active surface 50 of IC dies 48.

Figure 15:
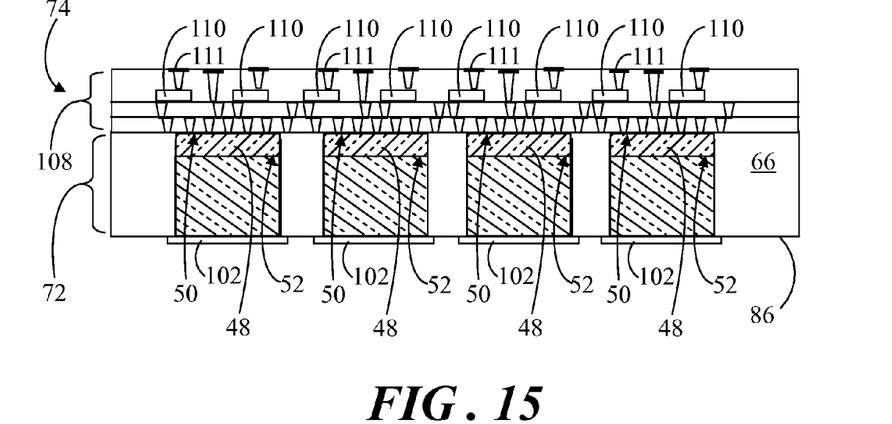
FIG. 15 shows a side view of the IC dies shown in FIG. 14 further along in processing.

Next, a task 106 is performed. At task 106, one or more device layers are formed on active surface 50 of IC dies 74. Referring to FIG. 15 in connection with tasks 102 and 104, FIG. 15 shows a side view of IC dies 48 shown in FIG. 14 further along in processing. As illustrated, support substrate 56 (FIG. 14) has been removed from panel 74 of IC dies 48. In addition, panel 74 has been flipped such that top planar surface 86 with device layers 102 faces downward in this illustration. During processing of active surface 50, top planar surface 86 of panel 74 may be placed on a carrier (not visible) per conventional practices. Accordingly, active surface 50 of each of IC dies 48 is exposed. In this position, panel 74 undergo a final curing process to allow molding compound 66 of encapsulant layer 72 to further harden.

With continued reference to task 106 and FIG. 15, panel 74 of IC dies 50 undergoes processing to form device layers 108, or interconnects, on active surface 50 of each of IC dies 48. Device layers are formed in order to route signals, power, and ground lines between bond pads (not shown) on active surface 50 of each of IC dies 48 to external locations, such as to modules 110 within device layers 108 and/or to packages (not shown) external to panel 74 via pads 111 placed on an exterior of panel 74. Pads 111 can then be provided with a nickel-gold (NiAu) alloy or solder finish for land grid array (LGA) or solder balls for ball grid array (BGA). Routing may be performed using standard silicon manufacturing equipment. These processing steps can include the deposition of copper metallization layers by electroplating techniques. The metal layers are generally separated by insulating layers typically formed from a spin-coated photoimageable dielectric, and patterned using batch process lithography. The combination of metal layers and insulating layers are collectively represented by device layers 108. The number of metal layers in a package is dictated by the package size, land grid array or ball grid array pitch requirement, input/output count, power and ground requirements, the inclusion of other devices, packages, or modules 110, routing design rules, and so forth.

Referring back to IC die packaging process 32 of FIG. 2, following task 106, a task 112 is performed. At task 112, panel 74 is separated into individual IC die packages. Following task 112, IC die packaging process 32 exits.

Figure 16:
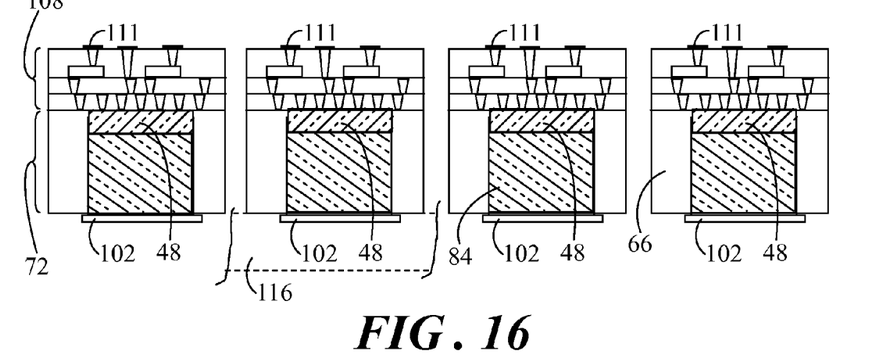
FIG. 16 shows a side view of IC die packages resulting from execution of the IC die packaging process of FIG. 2.

FIG. 16 shows a side view of the IC die packages 114 resulting from execution of IC die packaging process 32 of FIG. 2. At this point IC die packages 114 having IC dies 48 packaged therein can be further processed in preparation for their incorporation into electronic devices. By way of example, planar top surface 86 and device layers 102 may be connected to a customer provided radio board 116, one of which shown in ghost form. Although only one IC die 48 per IC die package 114 is shown, it should be understood that each of IC die packages 114 may include multiple IC dies 48. In such an embodiment, the multiple IC dies 48 within one of packages 114 may be interconnected by conductive structures in device layers 108.

An embodiment described herein comprises a method of packaging an integrated circuit (IC) die that includes a backside metallization technique. Prior to singulation, a laminating material is applied to a backside of a wafer having integrated circuits built thereon. The wafer is then separated into discrete IC dies, with the laminating material remaining on a back surface of the individual IC dies. Packaging entails a chips-first methodology in which the package is built around the bare IC dies. As such, the IC dies are placed active side down on a support substrate, and molding compound is dispensed over the IC dies and laminating material to form a panel of IC dies. After the molding compound has hardened, at least a section of the molding compound and the laminating material overlying the back surface of each of the IC dies is removed. The openings are filled with a conductive material that functions as a heat sink for removing heat from the IC die and/or functions as a ground path for the IC die. In addition to providing effective heat dissipation and a ground for IC die, the method enables both surfaces, i.e., the active surface and a top planar surface in communication with the back surface of the IC die, to be built up. The method eliminates the need for external copper slugs that act as heat sinks, which simplifies process flow and decreases package height. Accordingly, thinner IC die packages are enabled with thermal regulation and grounding being addressed. Such methodology can achieve significant manufacturing savings and decrease component size while concurrently producing high reliability components.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A method of packaging an integrated circuit (IC) die, said IC die having a first surface and a second surface, said first surface being an active side of said IC die, and said method comprising:
    applying a laminating material to said second surface of said IC die;
    positioning said active surface of said IC die on a support substrate;
    following said positioning operation, forming an encapsulant layer overlying said laminating material and said IC die, said encapsulant layer being formed from a molding compound;
    removing said molding compound and said laminating material from said second surface of said IC die to form an opening exposing said second surface;
    placing a conductive material in said opening; and
    releasing said IC die from said support substrate following said placing operation.

2. A method as claimed in claim 1 wherein said IC die is one of multiple IC dies formed on a wafer substrate, said wafer substrate having a backside, and:
    said applying operation comprises applying said laminating material to said backside of said wafer substrate, such that said laminating material is applied to said second surface of each of said multiple IC dies; and
    said method further comprises separating said wafer substrate into discrete ones of said multiple IC dies prior to said forming operation.

3. A method as claimed in claim 1 wherein said laminating material is a dry film.

4. A method as claimed in claim 1 wherein said removing operation comprises utilizing a laser device to remove said molding compound and said laminating material.

5. A method as claimed in claim 1 wherein said removing operation comprises etching said molding compound and said laminating material to form said opening.

6. A method as claimed in claim 1 wherein said removing operation produces said opening that exposes substantially an entirety of said second surface.

7. A method as claimed in claim 1 wherein said placing operation comprises filling said opening with said conductive material and forming a planar top surface spaced apart from said second surface of said IC die by said conductive material.

8. A method as claimed in claim 1 further comprising attaching a mold frame to an exposed side of said support substrate, and said active surface of said IC die is positioned on said support substrate within said mold frame.

9. A method as claimed in claim 1 wherein said IC die is one of multiple IC dies, and said method further comprises:
    positioning said active surface of each of said multiple IC dies on said support substrate;
    concurrently forming said encapsulant layer overlying said laminating material on each of said multiple IC dies to produce a panel;
    removing said molding compound and said laminating material from said second surface of said each of said multiple IC dies to form said opening exposing said second surface of said each of said multiple IC dies;
    placing said conductive material in said opening of said each of said multiple IC dies; and
    separating said multiple IC dies of said panel to form individual IC packages.

10. A method of packaging an integrated circuit (IC) die, said IC die having a first surface and a second surface, said first surface being an active side of said IC die, and said method comprising:
    applying a laminating material to said second surface of said IC die;
    forming an encapsulant layer overlying said laminating material and said IC die, said encapsulant layer being formed from a molding compound;
    removing said molding compound and said laminating material from said second surface of said IC die to form multiple openings exposing a section of said second surface in a pre-determined pattern; and
    placing a conductive material in said opening.

11. A method of packaging an integrated circuit (IC) die, said IC die having a first surface and a second surface, said first surface being an active side of said IC die, and said method comprising:
    applying a laminating material to said second surface of said IC die;
    forming an encapsulant layer overlying said laminating material and said IC die, said encapsulant layer being formed from a molding compound;
    removing said molding compound and said laminating material from said second surface of said IC die to form an opening exposing said second surface; and
    placing a conductive material in said opening, said placing operation including depositing a metal film in said opening, overlaying a portion of said metal film with a non-conductive material, and forming a planar top surface spaced apart from said second surface of said IC die.

12. A method of packaging multiple integrated circuit (IC) dies, each of said multiple IC dies having a first surface and a second surface, said first surface being an active side of said each of said multiple IC dies, and said method comprising: applying a laminating material to said second surface of said each of said multiple IC dies; positioning said active surface of said each of said multiple IC dies on a support substrate; concurrently forming an encapsulant layer overlying said laminating material and said multiple IC dies, said encapsulant layer being formed from a molding compound; removing said molding compound and said laminating material from said second surface of said each of said multiple IC dies to form an opening exposing said second surface of said each of said multiple IC dies; placing a conductive material in said opening of said each of said multiple IC dies and forming a planar top surface spaced apart from said second surface of said each of said multiple IC dies by said conductive material;

releasing said multiple IC dies from said support substrate as a panel following said placing operation; and separating said multiple IC dies of said panel to form individual IC packages.

13. A method as claimed in claim 12 wherein multiple IC dies are formed in a wafer substrate, said wafer substrate having a backside, and:
    said applying operation comprises applying said laminating material to said backside of said wafer substrate, such that said laminating material is applied to said second surface of said each of said multiple IC dies; and
    said method further comprises separating said wafer substrate into discrete ones of said multiple IC dies prior to said positioning operation.

14. A method as claimed in claim 12 wherein said placing operation comprises filling said opening with said conductive material to form said planar top surface.

15. A method as claimed in claim 12 wherein said placing operation comprises:
    depositing a metal film in said opening; and
    overlaying a portion of said metal film with a nonconductive material to form said planar top surface.

16. A method as claimed in claim 12 further comprising:
    forming at least one first device layer on said active surface of said each of said multiple IC dies following said releasing operation; and
    forming at least one second device layer overlying said planar top surface, said second device layer being in communication with said second surface of said each of said multiple IC dies via said conductive material, and said forming on said active surface and overlying said planar top surface occurring prior to said separating operation.

* * * * *